US009557237B2

(12) United States Patent
McNeal et al.

(10) Patent No.: US 9,557,237 B2
(45) Date of Patent: *Jan. 31, 2017

(54) MEMS PRESSURE SENSOR FIELD SHIELD LAYOUT FOR SURFACE CHARGE IMMUNITY IN OIL FILLED PACKAGING

(71) Applicant: Sensata Technologies, Inc., Attleboro, MA (US)

(72) Inventors: Mark P. McNeal, Northborough, MA (US); Douglas B. Strott, Andover, MA (US); Stephen P. Greene, Scituate, RI (US)

(73) Assignee: SENSATA TECHNOLOGIES, INC., Attleboro, MA (US)

( * ) Notice: Subject to any disclaimer, the term of this patent is extended or adjusted under 35 U.S.C. 154(b) by 21 days.

This patent is subject to a terminal disclaimer.

(21) Appl. No.: 14/539,044

(22) Filed: Nov. 12, 2014

(65) Prior Publication Data

US 2015/0135854 A1    May 21, 2015

Related U.S. Application Data

(63) Continuation-in-part of application No. 14/082,562, filed on Nov. 18, 2013.

(51) Int. Cl.
| | | |
|---|---|---|
| *G01F 1/80* | (2006.01) | |
| *G01L 9/06* | (2006.01) | |
| *G01F 1/44* | (2006.01) | |
| *G01F 1/76* | (2006.01) | |
| *H01L 41/25* | (2013.01) | |
| *G01L 9/00* | (2006.01) | |
| *G01L 19/06* | (2006.01) | |

(52) U.S. Cl.
CPC . *G01L 9/06* (2013.01); *G01F 1/44* (2013.01); *G01F 1/76* (2013.01); *G01L 9/0054* (2013.01); *G01L 9/0055* (2013.01); *G01L 19/069* (2013.01); *H01L 41/25* (2013.01); *Y10T 29/42* (2015.01)

(58) Field of Classification Search
CPC ................. G01L 9/00; G01L 7/08; G01F 1/80
USPC .................................. 73/723, 715, 861.351
See application file for complete search history.

(56) References Cited

U.S. PATENT DOCUMENTS

| 4,131,088 | A | † | 12/1978 | Reddy | |
|---|---|---|---|---|---|
| 4,347,745 | A | † | 9/1982 | Singh | |
| 5,231,301 | A | † | 7/1993 | Petersen | |
| 6,952,042 | B2 | † | 10/2005 | Stratton | |
| 2006/0214202 | A1 | † | 9/2006 | Zorich | |
| 2013/0264664 | A1 | † | 10/2013 | Nimura | |
| 2015/0135853 | A1 | * | 5/2015 | McNeal | ................ G01L 9/0054 73/861.351 |

* cited by examiner
† cited by third party

*Primary Examiner* — Jewel V Thompson
(74) *Attorney, Agent, or Firm* — Adler Pollock & Sheehan P.C.; George N. Chaclas, Esq.; Daniel J. Holmander, Esq.

(57) ABSTRACT

A pressure sensing element includes a sensing sub-element disposed on a diaphragm, the element including a shield disposed over the sub-element and configured to substantially eliminate influence of external charge on the sub-element during operation. A method of fabrication and a pressure sensor making use of the pressure sensing element are disclosed.

14 Claims, 14 Drawing Sheets

MEMS PRESSURE SENSOR FIELD SHIELD LAYOUT FOR SURFACE CHARGE IMMUNITY IN OIL FILLED PACKAGING

CROSS REFERENCE TO RELATED APPLICATIONS

This application is filed under 37 CFR 1.53(b) as a Continuation in Part and claims benefit under 35 U.S.C. §120 to U.S. patent application Ser. No. 14/082,562, filed Nov. 18, 2013, entitled, "MEMS Pressure Sensor Field Shield Layout for Surface Charge Immunity in Oil Filled Packaging," the entire disclosure of which is incorporated by reference herein.

BACKGROUND OF THE INVENTION

1. Field of the Invention

The invention disclosed herein relates to pressure sensors, and in particular to design of a pressure sensor to limit influence of surface charge accumulation in oil filled packages.

2. Description of the Related Art

Offset drift due to surface charge accumulation is a well-known phenomenon and common failure mode occurring in a wide variety of semiconductor devices. The failure mechanism involves device surface charge accumulation which drives formation of charge inversion layers. The inversion layers compromise otherwise electrically isolating junction states. Growth of the charge inversion layer permits parasitic current leakage through the epi-layer, resulting in sensing element offset drift. As with many other types of devices, pressure sensing elements are influenced by this phenomenon.

Present day designs for pressure sensing elements that include a field shield are susceptible to surface charge accumulation and exhibit severe offset drift due to sense element charging. This is especially the case when deployed in oil encapsulated package assemblies and applications.

In many package configurations, the pressure sensing element is encapsulated by a dielectric oil. The oil provides for coupling of external absolute or differential pressure inputs with the sense element. Unfortunately, this also serves to couple external, electrostatic charge residing on the package, or elsewhere, to the sensing surface of the pressure sensing element. Typically, charge coupling occurs through polar alignment of molecules in the oil in response to an external field, and associated space charge accumulation at an interface of the sense element and the oil. Consequently, comparatively large external static charge may be coupled to the sensing element via the molecular polarizability of the oil. Such charge may be residing on, for example, plastic housing assemblies used to package the sensing element or introduced to the housing by electrostatic discharge (ESD) to the plastic package. This high static charge is more than sufficient to cause severe output shift.

Thus, what are needed are methods and apparatus to improve the performance of pressure sensors encapsulated in an oil containing package.

SUMMARY OF THE INVENTION

In one embodiment, a pressure sensing element is provided. The pressure sensing element includes a sensing sub-element disposed on a diaphragm, the element including a shield disposed over the sub-element and a field shield circuit configured to substantially eliminate influence of external charge on the sub-element during operation by applying a potential to a substrate of the diaphragm and the field shield.

The sub-element may include at least one piezoresistive element. The sub-element may be implanted into the diaphragm. A layer may be disposed between the field shield and the sub-element, and may include a passivation layer. The field shield may be configurable to substantially eliminate signal leakage within the sensing element. The field shield may be disposed over the sub-element by deposition and photolithography. Sources of the external charge may include at least one of oil in which the sensing element is at least partially immersed and other components surrounding the sensing element.

In another embodiment, the method for fabricating a pressure sensing element is provided. The method includes selecting a pressure sensing element including a sub-element disposed on a diaphragm; and disposing a field shield over the sub-element, a contact via and an interconnect disposed between the sub-element and the contact via, the field shield configured to substantially eliminate influence of external charge on the sub-element during operation by operation of a field shield circuit configured to apply a potential to a substrate of the diaphragm and the field shield.

The method may include disposing a layer between the field shield and the sub-element. In some embodiments, configuring includes covering the interconnect, the contact via and the sub-element with a metallic (or electrically conducting) composition to limit the influence of the external charge.

In a further embodiment, a pressure sensor is disclosed. The pressure sensor includes a pressure sensing element including a sensing sub-element disposed on a diaphragm, the element including a shield disposed over the sub-element, a contact via and an interconnect disposed between the sub-element and the contact via, the field shield configured to substantially eliminate influence of external charge on the sub-element during operation by operation of a field shield circuit configured to apply a potential to a substrate of the diaphragm and the field shield; and a port for exposing the pressure sensing element to a pressure environment. At least another pressure sensing element may be included in the pressure sensor.

The pressure sensor may include another port and another pressure sensing element. A top side of the diaphragm and a back side of the port may be coupled by a reservoir of oil. Measurements of differential pressure may span a range of between about 0.2 bar and 1 bar. The sensor may be configured for measuring differential pressure across a Venturi flow tube. The sensor may be configured for measuring mass air flow.

BRIEF DESCRIPTION OF THE DRAWINGS

The features and advantages of the invention are apparent from the following description taken in conjunction with the accompanying drawings in which.

DETAILED DESCRIPTION OF THE INVENTION

Disclosed herein are methods and apparatus for limiting the influence of surface charge or large static charge accumulation that may cause signal offset in a pressure sensor. Sources of the extraneous charge may include packaging of the sensing element. Advantageously, this generally results in immunity against drift in output data from the sensor.

Figure 1:
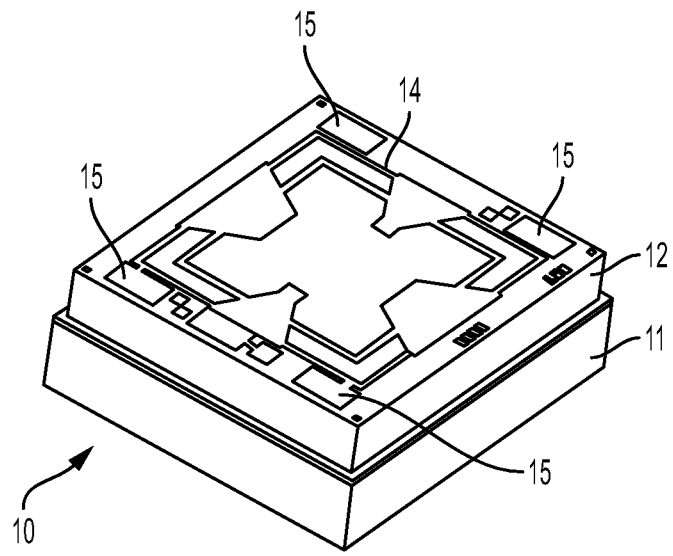
FIG. 1 is an isometric diagram depicting aspects of an exemplary pressure sensing element according to the teachings herein.

Referring now to FIG. 1, there is shown a pressure sensing element 10 according to the teachings herein. In this embodiment, the pressure sensing element 10 includes a pedestal 11 as a base to the pressure sensing element 10. The pedestal 11 may be formed of a suitable material such as glass. Disposed on top of the pedestal 11 is a silicon die 12. The silicon die 12 may be bonded to the pedestal 11 using techniques as are known in the art. The silicon die 12 is host to a circuit 14. Included in the circuit 14 is a plurality of bond pads 15. The bond pads 15 provide for electrical connection of the circuit 14 for the pressure sensing element 10 with external components. Generally, the external components provide for powering and receiving data from the pressure sensing element 10 and processing the data.

Figure 2:
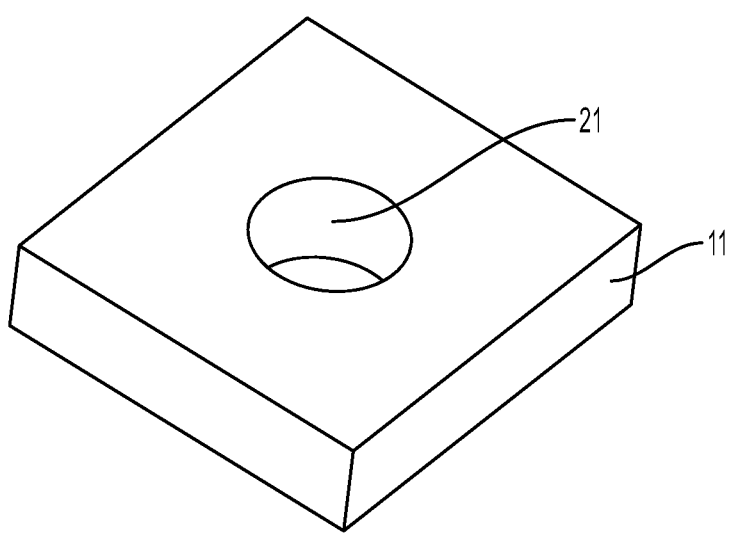
FIG. 2 is an isometric diagram depicting aspects of a pedestal for the pressure sensing element of FIG. 1.

Referring to FIG. 2, a perspective view of an embodiment of the pedestal 11 is shown. In this example, other components of the pressure sensing element 10 have been omitted such that features of the pedestal 11 may be better presented. In this example, the pedestal 11 includes a central thruway 21 that provides a pressure port for sampling pressure. Accordingly, the thruway 21 is also referred to herein as a "port" 21. The port 21 may be provided in a variety of forms. For example, it is not necessary that the thruway 21 be provided as a singular, cylindrical penetration through a center of the pedestal 11 as shown. In one embodiment, the thruway 21 includes a plurality of smaller perforations through a thickness of the pedestal 11. In another embodiment (not shown), the central thruway 21 may be omitted or terminate at some depth in the glass, forming a cavity in conjunction with silicon die 12. In this embodiment, the cavity may be evacuated or backfilled to a fixed reference pressure, configuring sensing element 10 for absolute pressing sensing.

Figure 3:
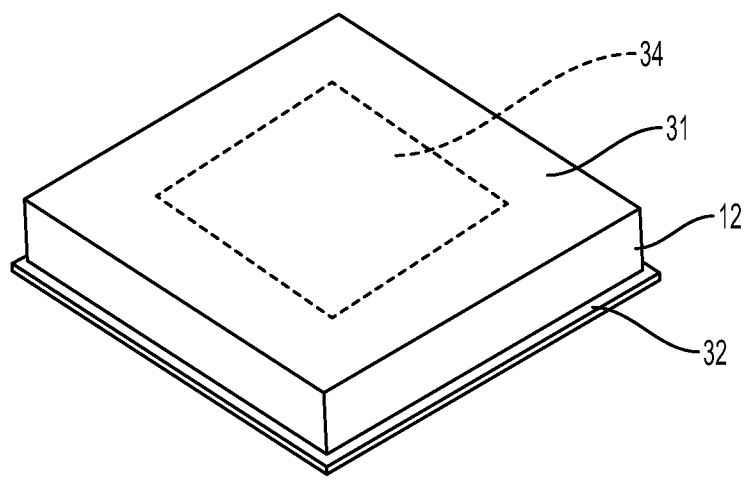
FIGS. 3 and 4 are isometric diagrams depicting aspects of a silicon die for the pressure sensing element of FIG. 1.

Referring now to FIG. 3, a perspective view of an embodiment of the silicon die 12 is shown. In this example, other components of the pressure sensing element 10 have been omitted such that features of the silicon die 12 may be better presented. In this example, the silicon die 12 includes an optional flange 32. The flange 32 may be useful for assembly of the pressure sensing element 10. For example, during assembly, mechanical pressure may be applied to the flange 32 such that an underlying adhesive is evenly distributed and compressed onto the pedestal 11. The silicon die 12 includes a top 31. Generally, the top 31 includes a substantially planar surface. Within a central portion of the top 31 is a diaphragm 34. Generally, the diaphragm 34 will flex according to pressure experienced by the pressure sensing element 10.

Figure 4:
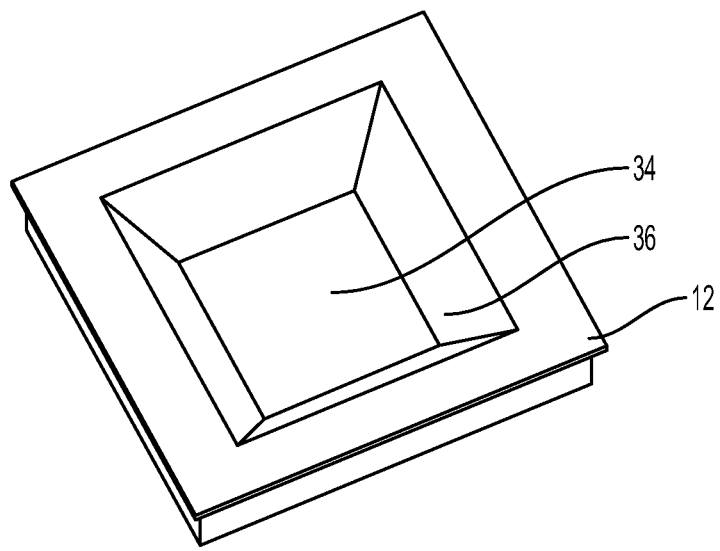

Referring now to FIG. 4, a perspective view of an underside of the silicon die 12 is shown. In this example, the silicon die 12 includes a cavity 36. When the silicon die 12 is mated with the pedestal 11, the cavity 36 results in a chamber. Generally, the cavity 36 is defined by a wall (such as where the cavity 36 is cylindrical in form), or a plurality of walls (as shown in FIG. 4). The diaphragm 34 is defined by a base of the cavity 36, and may be of a substantially uniform thickness.

Figure 5:
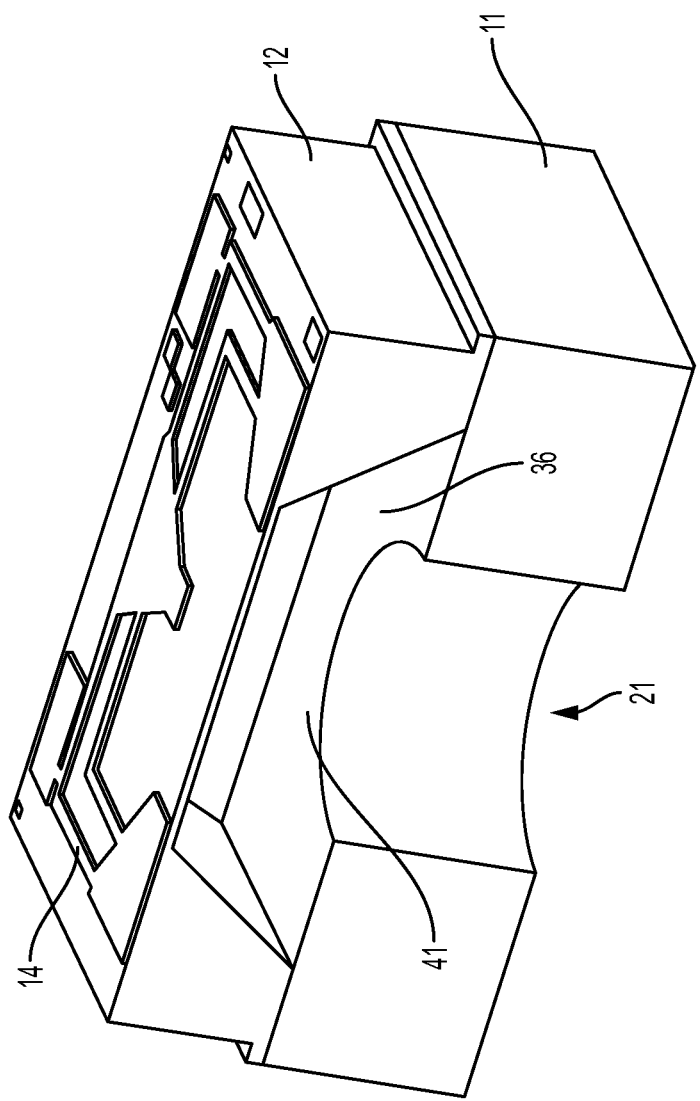
FIG. 5 is a cutaway isometric diagram of the pressure sensing element of FIG. 1.

Referring now to FIG. 5, a semi-transparent perspective view of the pressure sensing element 10 is shown. In this illustration, it may be seen that the cavity 36 of the silicon die 12 forms a chamber 41 when the silicon die 12 is mated with or joined to the pedestal 11.

In order to provide some context for the teachings herein, aspects of a prior art sensor are introduced and discussed with regard to FIGS. 6-9.

Figure 6:
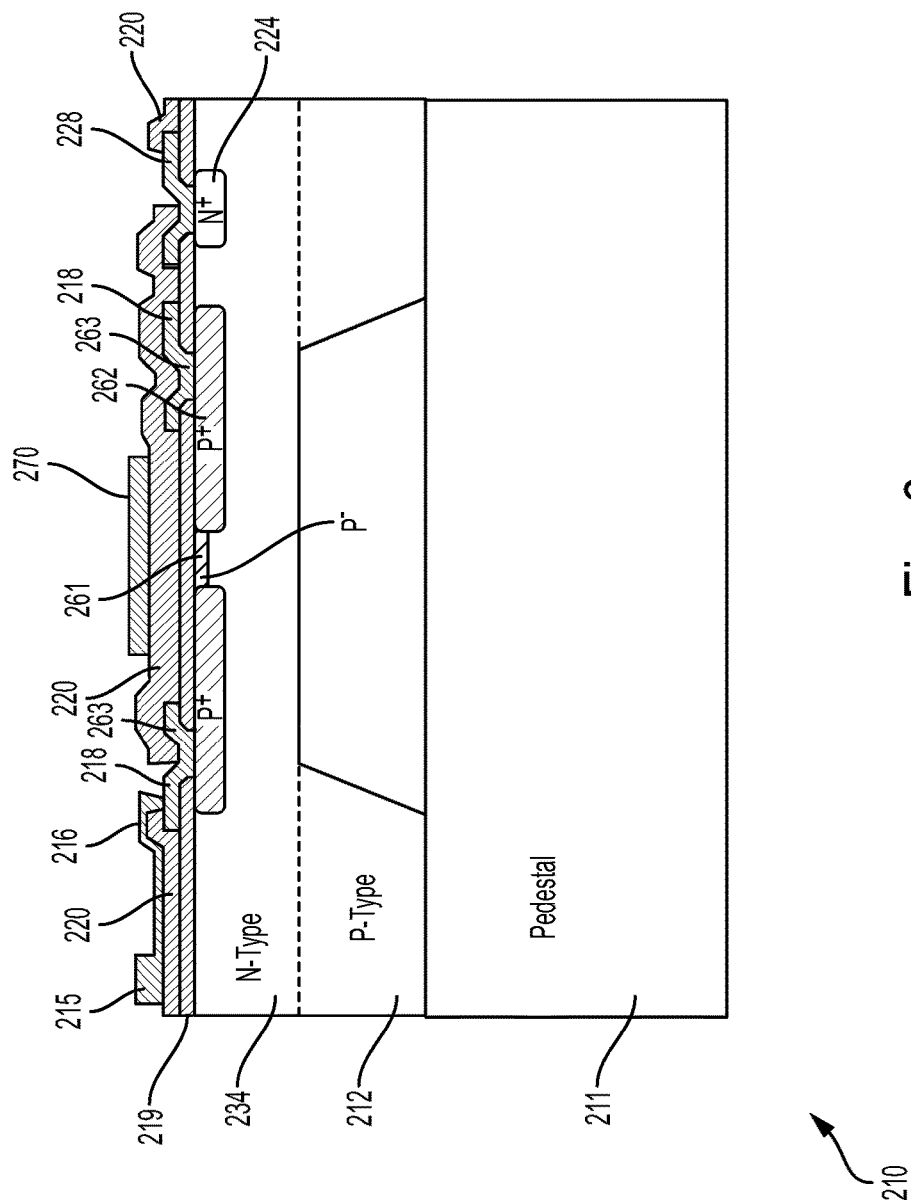
FIG. 6 is a composite cut-away view of a prior art sensing element.
Figure 7:
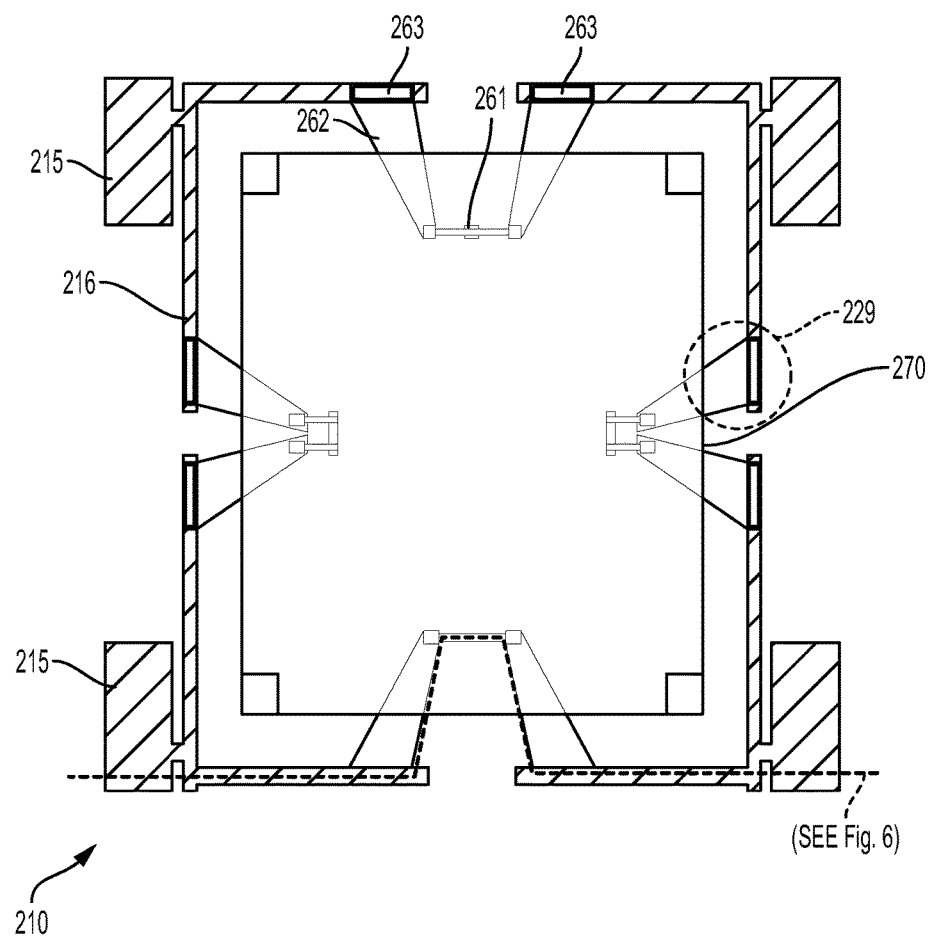
FIG. 7 is a top down view of the prior art sensing element of FIG. 6.

Referring now to FIG. 6, a composite cross-section of a prior art sensor to 10 is shown. Refer also to FIG. 7, where a dashed line towards the bottom of the diagram indicates the portions of the cross section of the prior art sensor 210 that are depicted.

The exemplary prior art sensor 210 includes pedestal 211. Disposed on top of the pedestal 211 is silicon die 212. In an upper most portion of the silicon die 212 is the diaphragm 234. In this embodiment, a lower portion of the silicon die 212 is fabricated of P type semiconductor material, while the diaphragm 234 is fabricated from N type semiconductor material. In other embodiments, the lower portion of the silicon die 212 is fabricated of N type semiconductor material and the diaphragm 234 is fabricated from the same N type material. Implanted within the diaphragm 234 are interconnects 262. The interconnects 262 are fabricated of a P+ type of semiconductor material. P+ refers to highly acceptor doped region of semiconductor to achieve suitably low resistivity (high conductivity). The interconnects 262 provide for connection to a sensing sub-element 261. In this example, the sensing sub-element 261 is of a P− type of semiconductor material. P− refers to lower acceptor doped region of semiconductor as required to achieve desired resistance and piezoresistive coefficient. A sensor contact via 263 provides electrical contact to each of the respective interconnects 262. The electrical contact is accomplished with sensor contact 218.

A first passivation layer 219 provides for electrical separation of the sensor contact metal 218 from other components. Each sensor contact via 263 is in electrical communication with a bridge trace 216. In turn, the bridge trace 216 is connected to at least one bond pad 215. The at least one bond pad 215 provides for external electrical connections. A bias via 224 provides for electrical contact with the diaphragm 234. The bias via 224 is electrically connected to a bias contact 228. A top passivation layer 220 may be disposed over the first passivation layer 219, the sensor contacts 218, the bridge trace 216, and at least a portion of the bias contact 228.

Disposed over a portion of the prior art sensor 210, is a partial field shield 270. Generally, the partial field shield 270 provides for application of an electric potential that limits susceptibility to surface charge accumulation in particular environments. Exemplary environments include oil filled environments.

When the prior art sensor 210 is energized, a voltage, V, is applied to the bond pad 215. Current, I, flows to a first sensor contact 218 and into a first one in a pair of interconnects 262. The current passes through the sensing sub-element 261, onto the second one in a pair of interconnects 262 and out through a second sensor contact 218. (As a matter of convenience, an assembly of a first interconnect 262, the sensing sub-element 261, and the second interconnect 262 is referred to as a "resistive bridge" and by other similar terms). Flexing of the diaphragm 234 causes a change in the resistance of the sensing sub-element 261, and therefore a change in the signal at the second sensor contact 218.

Generally, each interconnect 262 includes highly doped P type material, while the sensing sub-element 261 includes lowered doped P type material. Accordingly, during operation, a P/N junction forms (refer also to FIG. 8, wherein the P/N junction 279 is shown). The P/N junction 279 provides electrical isolation of the resistive bridge from the N type semiconductor material 234. Thus, leakage of current, I, and therefore signal loss is reduced.

Unfortunately, design of the prior art sensor 210 is such that the partial field shield 270 does not completely cover sensing components. Among other things, designs for prior art sensors 210 have been such that enhancement of coverage provided by the partial field shield 270 would cause, at least in some cases, short-circuiting of the partial field shield 270 with the resistive bridge.

As a result, the partial field shield 270 has left at least a portion of each resistive bridge exposed to the sensing environment. In some embodiments, there has been a limited interference as a result. However, in some other embodiments, such as where the sensing environment is filled with oil, signal leakage occurs. Referring now to FIG. 7, it may be seen that signal leakage may arise in the unshielded region 299. Of course, it should be recognized that the unshielded region 299 shown in FIG. 7, is merely for one interconnect 262 out of the eight (8) interconnects 262 shown in this prior art sensor 210. Accordingly, in some sensing environments, signal leakage may have a substantial impact on performance of the prior art sensor 210.

Figure 8:
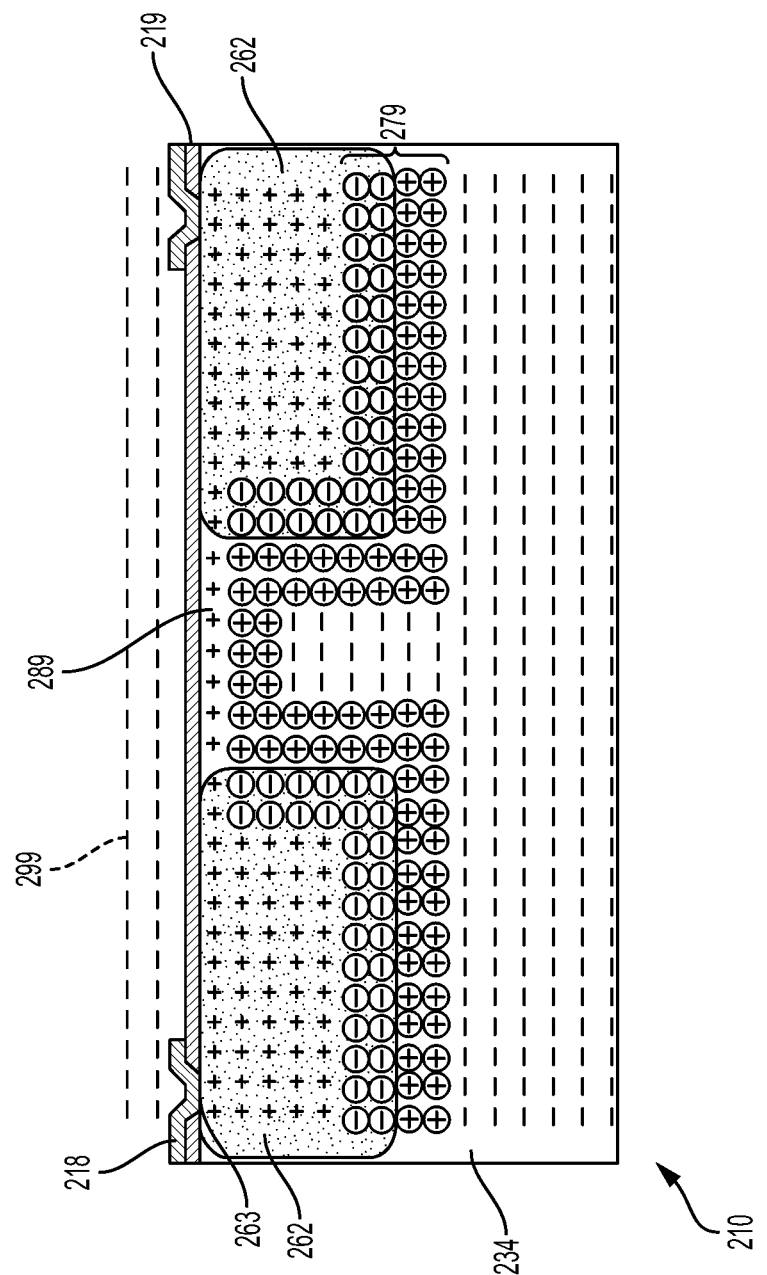
FIG. 8 is an illustration depicting charge collection phenomena for the prior art sensor of FIGS. 6 and 7.

Refer now also to FIG. 8 for a better understanding of this phenomena. FIG. 8 depicts a composite cross-sectional view of a portion of the prior art sensor 210, wherein the view is a close-up of the composite view provided in FIG. 6.

In FIG. 8, there is shown a negative surface charge that has accrued over the top of the prior art sensor 210. Generally, each interconnect 262, both of which are P+ type of semiconductor material, contains a substantial number of acceptors in a positive acceptor state. Similarly, the diaphragm 234, which is of an N type of semiconductor material, contains a substantial number of donors in a negative donor state. When the prior art sensor 210 is energized, the depletion region 279 forms at the P/N junction between each interconnect 262 and the N type semiconductor material 234 as the charged minority ions migrate within these components. Quite frequently, such as when the prior art sensor 210 is operated in an oil filled environment, polar molecules of the environment will align to cause the high negative surface charge that has accrued over the top of the prior art sensor 210. As a result the depletion region 279 grows, as minority charge carriers in the N type semiconductor 234 migrate to the interface creating an inversion layer 289, thus creating a current leakage path between P+ regions 262. With a current leakage path, device output drift ensues.

Turning to FIGS. 9-13, further aspects of the sensor 10 (shown in FIGS. 1-5) are shown. The sensor 10 overcomes the problems associated with the current leakage path of the prior art sensor 210 by, among other things, use of the field shield 70.

Figure 9:
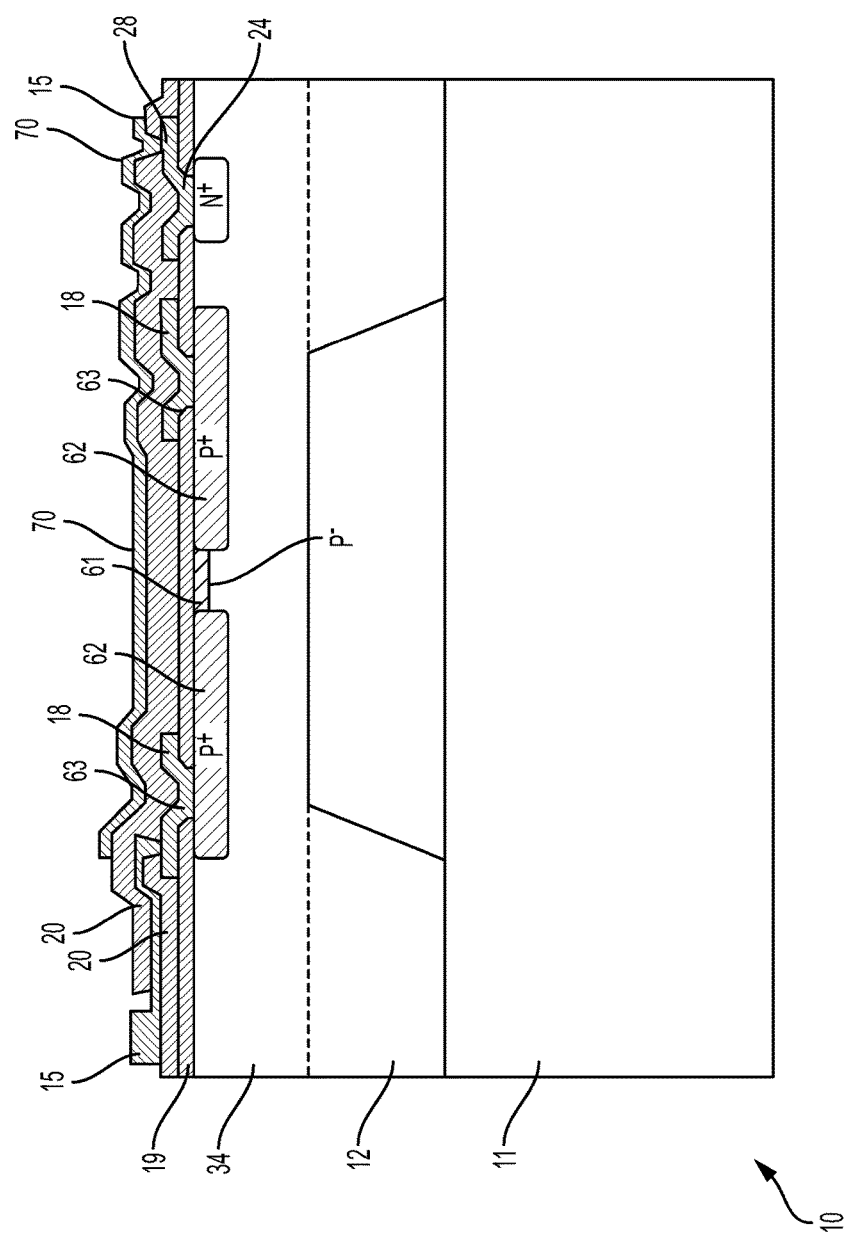
FIG. 9 is a composite cut-away view of the sensor of FIG. 1.
Figure 10:
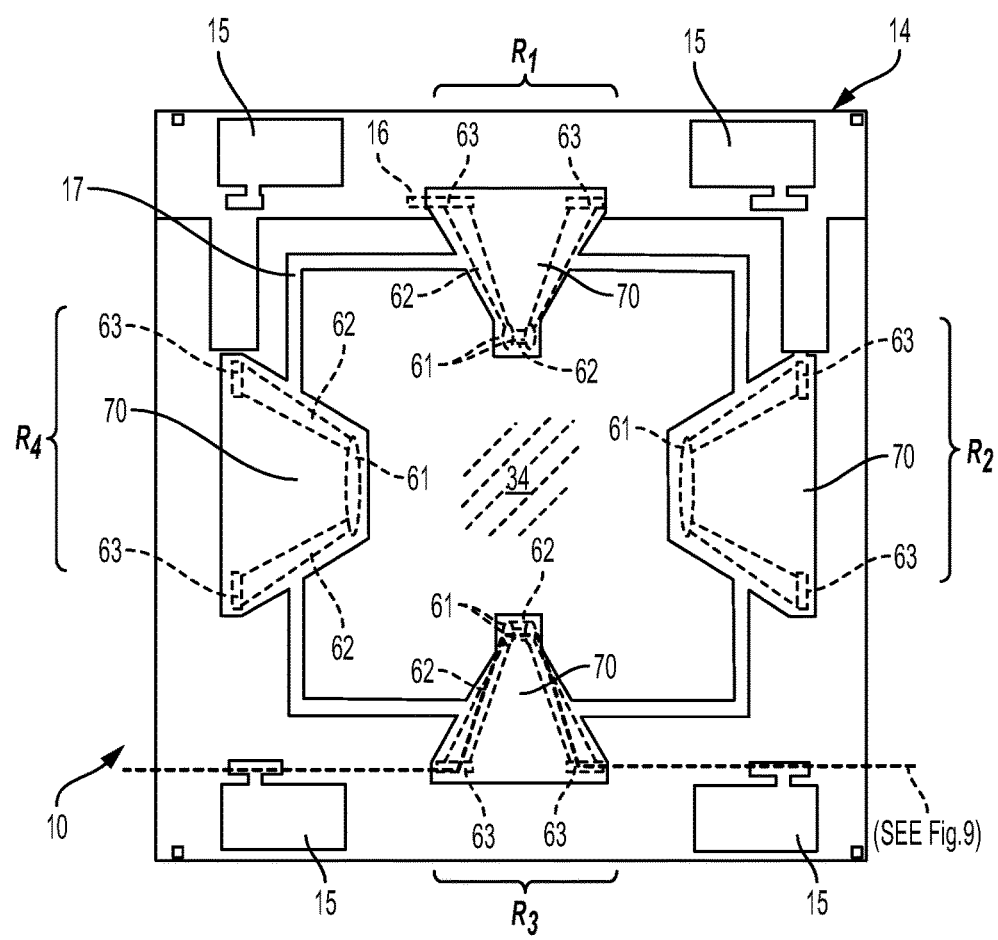
FIG. 10 is a top down view of the pressure sensing element of FIG. 1.

In FIG. 9, a composite cross-section of the sensor 10 is shown. Refer also to FIG. 10, where a dashed line towards the bottom of the diagram indicates the portions of the cross section of the sensor 10 that are depicted. Note that in FIG. 10, four sensing elements are shown. Each sensing element is denoted one of $R_1$, $R_2$, $R_3$, and $R_4$. Collectively, the four (4) sensing elements, $R_1$, $R_2$, $R_3$, and $R_4$, provide for the sensor 10. It should be understood that the sensor 10 may include additional or fewer sensing elements, and that grouping selected may be arranged in any manner determined appropriate to provide a desired function. Further, it should be understood that the circuit devices may be of any geometry (for example, shape, profile, width, thickness and the like) deemed appropriate. FIG. 9 provides a composite cross-section of one sensing element, $R_3$.

In the exemplary embodiment of the sensor 10, a pedestal 11 is included. Disposed on top of the pedestal 11 is silicon die 12. In an upper most portion of the silicon die 12 is the diaphragm 34. In this embodiment, a lower portion of the silicon die 12 is fabricated of P type semiconductor material, while the diaphragm 34 is fabricated from N type semiconductor material. In some other embodiments, the lower portion of the silicon die 12 is fabricated of N type semiconductor material and the diaphragm 34 is fabricated from the same N type material. Implanted within the diaphragm 34 are interconnects 62. The interconnects 62 are fabricated of a P+ type of semiconductor material. The interconnects 62 provide for connection to a sensing sub-element 61. In this example, the sensing sub-element 61 is of a P− type of semiconductor material. A sensor contact via 63 provides electrical contact to each of the respective interconnects 62. The electrical contact to each interconnect 62 is accomplished with a respective sensor contact 18.

The sensing sub-elements 61 may include any type of component that provides for measuring a deflection or distortion of the diaphragm 34. For example, the sensing sub-elements 61 may include piezoresistive elements formed by light, positively doped (P+) silicon. The sensing sub-elements 61 are electrically coupled to respective electrical contact vias 63 by respective highly positively doped (P+) solid-state interconnects 62. The electrical contact vias 63 and interconnects 62 may be fabricated from semiconductor materials such as positively doped semiconductor materials. At least a portion of the circuit 14 may be disposed onto the top of the silicon die 12 through techniques such as photolithography, by deposition, or by other techniques deemed appropriate. The electrical contact vias 63 and interconnects may be implanted in the material of the silicon die 12, with at least a portion of the circuit 14 disposed there over. A respective field shield 70 is disposed over the sensing sub-elements 61, the electrical contact vias 63, and the interconnects 62. The respective field shield 70 is disposed over and electrically insulated from sub-elements 61, the electrical contact vias 63, and the interconnects 62, by a thin passivation film of suitable material, typically vapor deposited $Si_3N_4$ and/or thermally grown $SiO_2$.

A first passivation layer 19 provides for electrical separation of each of the sensor contact 18 from other components. Each sensor contact via 63 is in electrical communication with a bridge trace 16. In turn, the bridge circuit 16 is connected to at least one bond pad 15. The at least one bond pad 15 provides for external electrical connections. A bias via 24 provides for electrical contact with the diaphragm 34. The bias via 24 is electrically connected to a bias contact 28. A top passivation layer 20 may be disposed over the first passivation layer 19, the sensor contacts 18, the bridge trace 16, and at least a portion of the bias contact 28.

Disposed over the electrical components within the sensor 10, is the field shield 70. Generally, the field shield 70 provides for shielding of the entire resistive bridge from the effects of negative surface charge that has accrued external to the sensor 10. Among other things, the field shield 70 provides for application of an electric potential that limits susceptibility to surface charge accumulation in particular environments. Exemplary environments include oil filled environments.

When the sensor 10 is energized, a voltage, V, is applied to the bond pad 15. Current, I, flows to a first sensor contact 18 and into a first interconnect 62 in a pair of the interconnects 62. The current passes through the sensing sub-element 61, onto a second interconnect 62 and out through a second sensor contact 18. (As a matter of convenience, an assembly of the first interconnect 62, the sensing sub-element 61, and the second interconnect 62 is referred to as a "resistive bridge" and by other similar terms). Flexing of the diaphragm 34 causes a change in the resistance of the sensing sub-element 61, and therefore a change in the signal at the second sensor contact 18.

Generally, each interconnect 62 includes highly doped P type material, while the sensing sub-element 61 may include a lower level of P type material. During operation, a P/N junction forms (refer also to FIG. 13, wherein a P/N junction 79 is shown). Advantageously, the P/N junction 79 provides electrical isolation of the resistive bridge from the N type of material 34. Thus, leakage of current, I, and therefore signal leakage is avoided.

Figure 12:
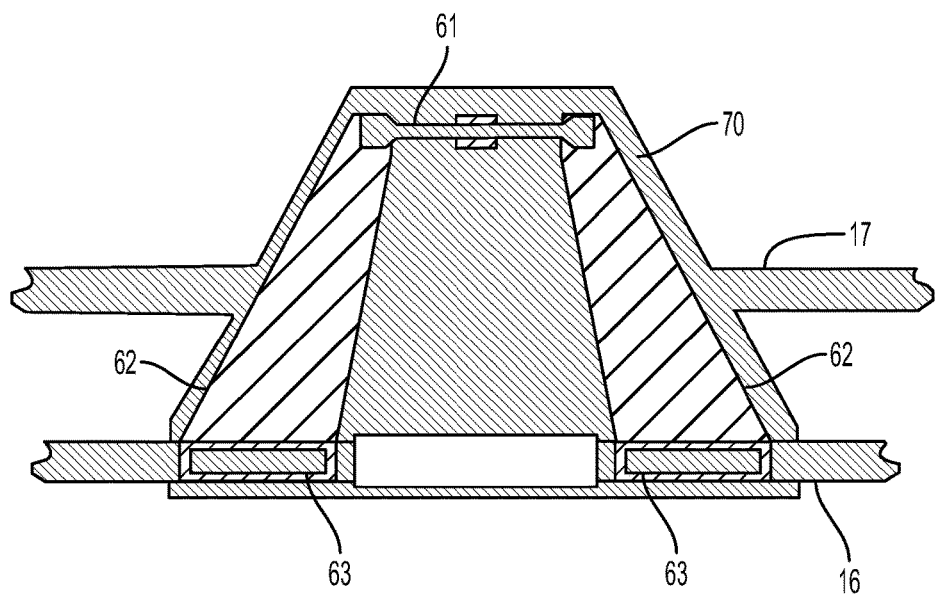
FIG. 12 is a cut-away view of a portion of the top view shown in FIG. 10.

As shown in FIGS. 10 and 12, a field shield circuit trace 17 extends across portions of the diaphragm 34. The field shield circuit trace 17 provides for electrical connection of a first field shield 70, with a second field shield 70 and so on.

Figure 11:
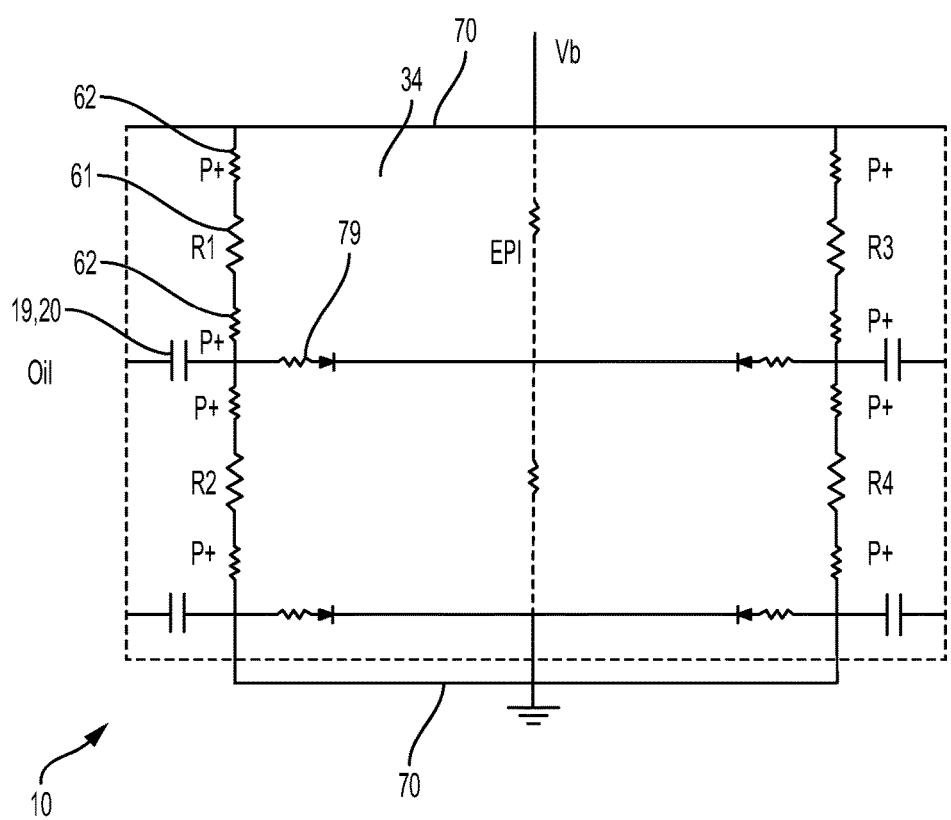
FIG. 11 is a schematic representation of an electrical circuit for the pressure sensing element of FIG. 1.

Refer now also to FIG. 11 wherein electrical schematic depiction of the sensor 10 is shown. In this example, the capacitor symbol represents the passivation layers 19, 20, for each of the sensing elements $R_1$, $R_2$, $R_3$, and $R_4$. The reverse biased junction diode represents the depletion region 79, for each of the sensing elements $R_1$, $R_2$, $R_3$, and $R_4$.

As shown in FIG. 12, the bridge circuit 16 and field shield circuit trace 17 are isolated by physical separation with passivation disposed therebetween. Each field shield 70 strategically covers all active areas of a respective sensing element. That is, each field shield 70 fully covers each sensor contact via 63, each interconnect 62, and each sensing sub-element 61. By use of the field shield 70, formation of the inversion layer that occurs in the prior art sensor 210 is avoided.

Figure 13:
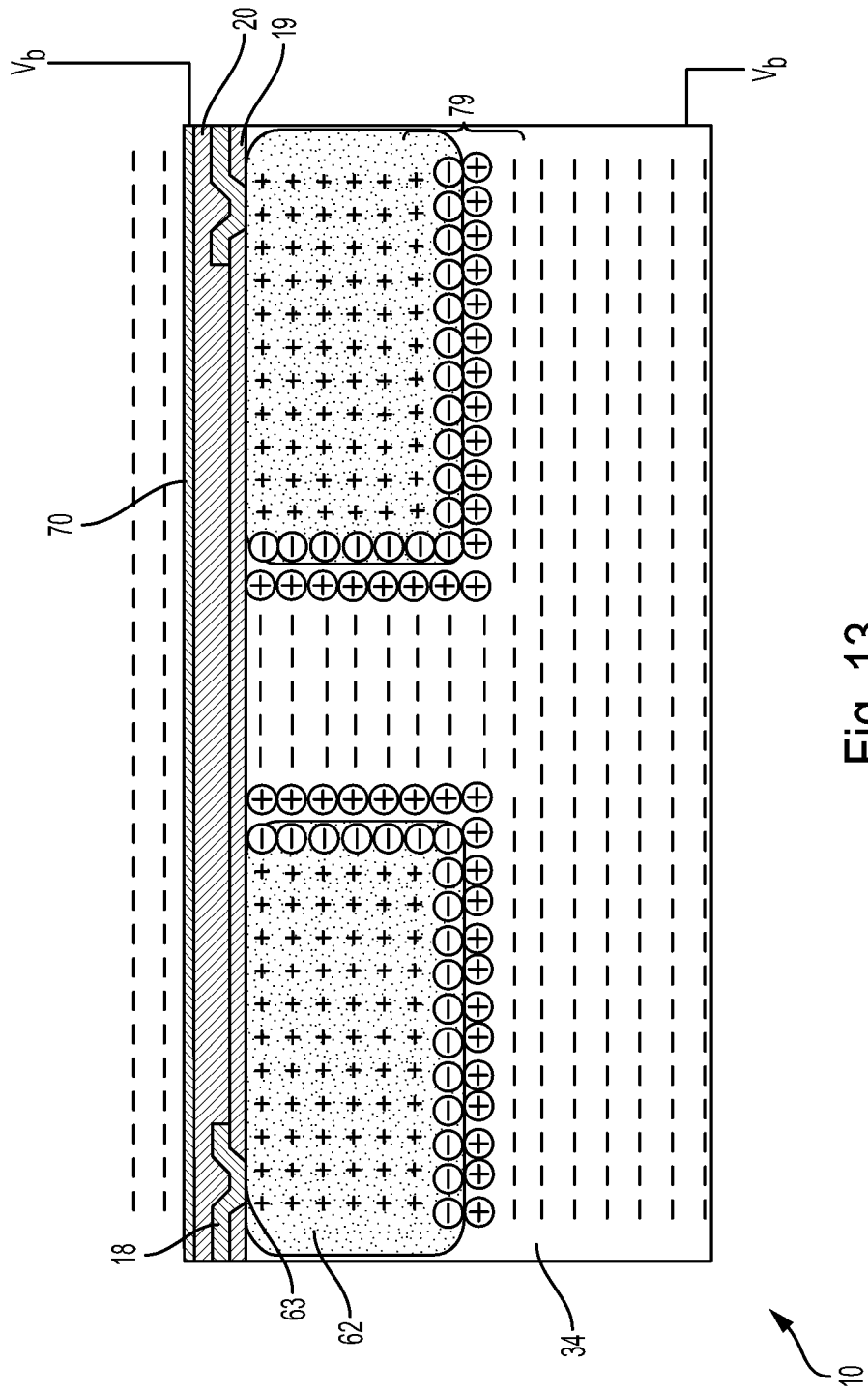
FIG. 13 is an illustration depicting immunity of the sensor of FIG. 1 from the charge collection phenomena for the prior art sensor of FIGS. 6 and 7.

As shown in FIG. 13, negative surface charge that has accrued over the top of the sensor 10 does not perturb operation of the sensor 10. That is, operation of the field shield 70 by applying voltage, V, to the field shield 70 and the N Type layer 34 causes a reduction in the depletion region 79 and substantially eliminates the inversion layer 289 that is formed in the prior art sensor 210.

This configuration has proven robustness under extremely high static charge build-up on surface of sense element.

Figure 14:
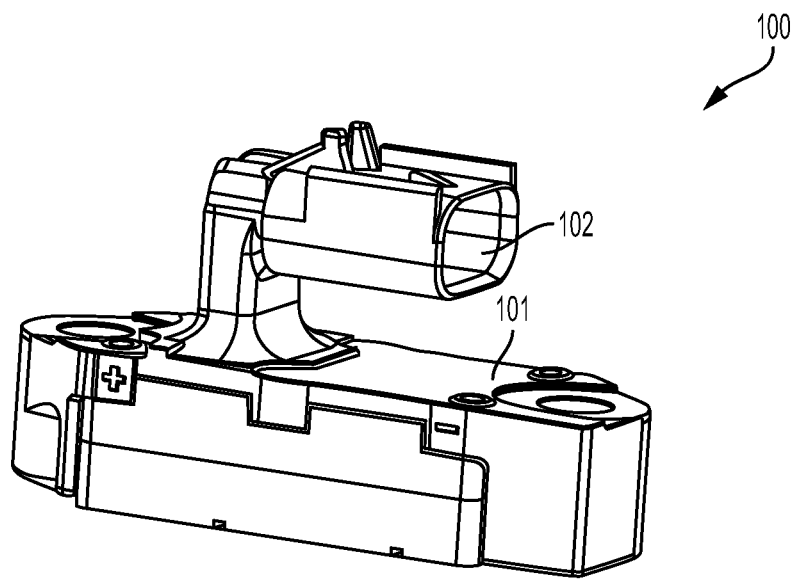
FIG. 14 is an isometric view of a pressure sensor that includes pressure sensing elements as shown in FIG. 1.

Referring now to FIG. 14, there is shown an exemplary pressure sensor 100. The pressure sensor 100 makes use of pressure sensing element 10 as disclosed herein.

Figure 15:
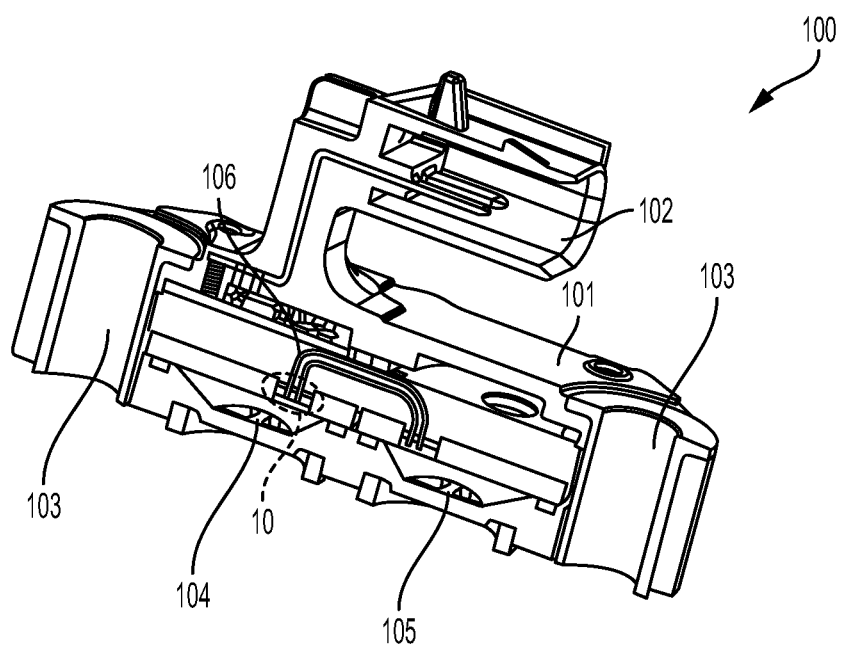
FIG. 15 is a cutaway view of the pressure sensor depicted in FIG. 14.

FIG. 15 is a cutaway view of the illustration of FIG. 14. The exemplary pressure sensor 100 includes a body 101. The body 101 includes a port 102. Generally, the port 102 houses connectors for providing external connection to electrical systems. The body 101 includes at least one mount 103. The at least one mount 103 is useful for securing the pressure sensor 100 in place. In this example, the pressure sensor 100 includes a high-pressure port 104 and a low-pressure port 105. Pressure is communicated between the high-pressure port 104 and the low-pressure port 105 by a tube 106. Generally, the tube 106 is filled with oil. Disposed at the high-pressure end of the tube 106 is a respective pressure sensing element 10.

The tube 106 may be considered as an embodiment of a reservoir of oil. The reservoir provides for coupling pressure port 21 of a pressure sensing element 10 to the low-pressure port 105. In this example, the reservoir of oil is provided in an extended tube or column. However, the reservoir may be of any geometry deemed appropriate for coupling environmental pressure to sensing element 10. For absolute pressure configuration port 21 forms reference cavity, with pressure coupled to sensing element top side 31. For relative or differential pressure sensing, the reservoir provides pressure coupling to central thruway 21, with at least another pressure port coupled to the opposing side of sensing element 10 as appropriate for determining differential pressure (i.e., pressurewise coupling). A high-pressure port 104 couples high pressure to the sensing element 10 top side diaphragm 34 for the configuration described in this disclosure.

Figure 16:
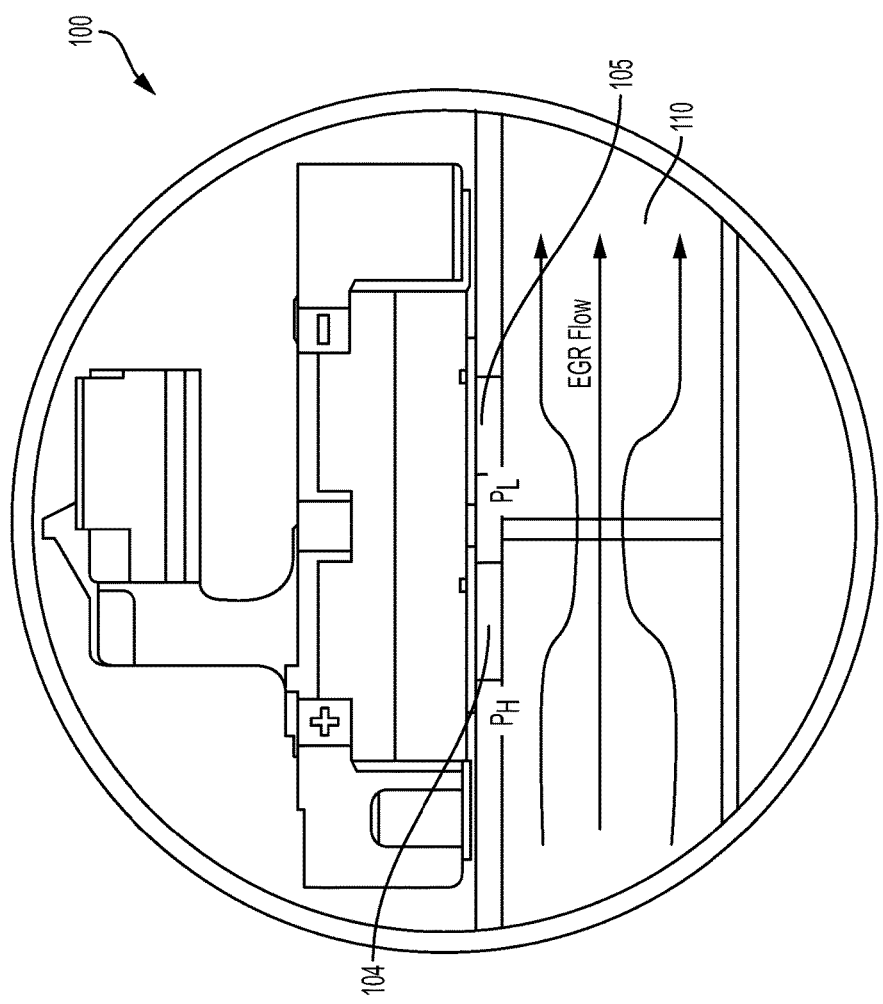
FIG. 16 is a schematic view depicting an application of the pressure sensor depicted in FIG. 1.

Referring now also to FIG. 16 where an embodiment of the exemplary pressure sensor 100 is shown installed. In this example, the pressure sensor 100 is installed on a pressurized environment 110. The pressurized environment 110 includes a flow (in this illustration, from left to right). An exemplary pressurized environment 110 includes exhaust gas recirculation flow. By enabling measurement of pressure in the high-pressure port 104 as well as pressure in the low-pressure port 105, a system making use of the pressure sensor 100 may be configured for making assessments of common pressure, differential pressure, flow dynamics and other related quantities.

Figure 17:
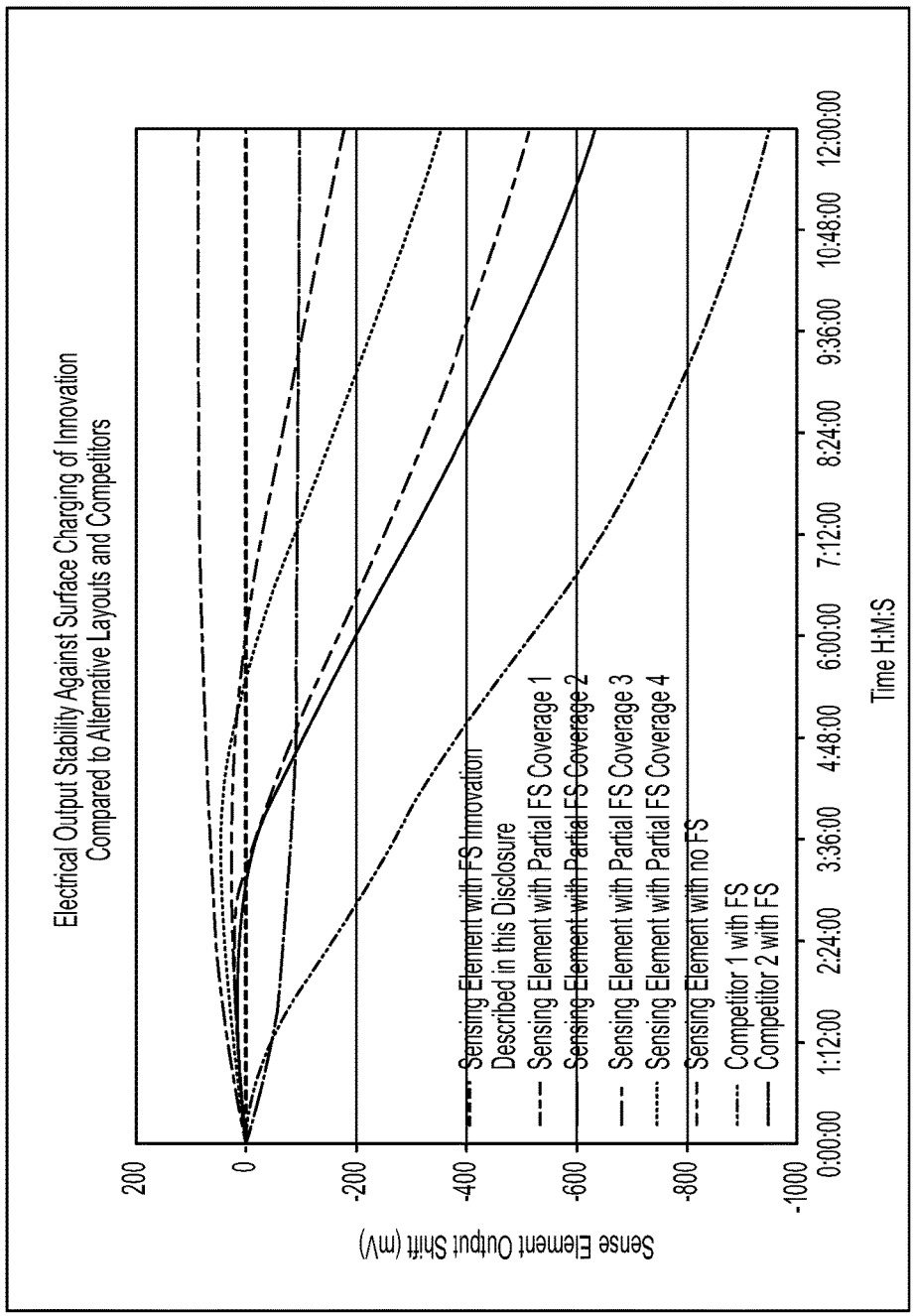
FIG. 17 is a graph depicting comparative performance of sensing elements.

FIG. 17 provides a graphical depiction of performance for embodiments of pressure sensors. In the embodiment designed according to the teachings presented herein, the sensor did not exhibit any drift at all. In contrast, drift for prior art designs ranged from moderate to substantial.

More specifically, and by way of non-limiting example, measurement of pressure drop across a Venturi flow tube enables calculation of mass airflow. In some embodiments, pressure differential that may be measured ranges from about 0.2 bar to about 1 bar. Common mode measurement of pressure range as high as about 8 bar.

Some additional aspects of the pressure sensing element 10 are now introduced.

Generally, each field shield may be extended to fully cover each implanted device circuit, contact vias and areas of the metal interconnects, as necessary to prevent formation of low resistance inversion channel between P+ interconnects. Typical prior art designs limit field shield coverage on the sensing element to the piezoresistive bridge and portions of the highly doped P+ interconnects, whereby uncovered implanted areas remain susceptible to charging and formation of inversion layer. Accordingly, design of the circuit devices may be modified to accommodate the piezoresistive elements, and to fully cover P+ doped interconnects, electrical contact vias, and metal interconnects, as needed for complete immunity against surface charging.

Specific to this innovation, the field shield metal, layout and method of deposition provide low membrane stress coupling for superior device performance of low pressure (less than about 1 Bar) die. The metal may be of any type common to the industry, including elemental, alloys or compound mixture. In practice, the field shield is isolated from the first metal layer by an intervening layer of passivation, for instance, silicon nitride, with contact vias to the diaphragm. The orientation and layout of sensing sub-elements, contact vias, and interconnects are such that area of metal coverage on diaphragm is minimized. Minimizing metal coverage insures minimum stress coupling from the metal field shield to sensing element diaphragm of low pressure die. Depositing films sufficiently thin insures maximum device sensitivity. Metal film thickness used is generally about 100 nm to about 50 nm or less. Thicker metals may be used as well. The field shield arrangement described herein may also be deployed on sensing elements of any pressure range (greater than about 1 Bar) die. In particular, completely covering the diaphragm of a low pressure die with a thick metal or other material degrades performance. Thicker films shift the neutral stress axis away from the piezoresitive elements, therefore lowering sensitivity; and introduce higher mechanical stress coupling to the membrane, therefore impacting accuracy and over-life stability. In operation, an equivalent potential is applied to both field shield layer and the diaphragm, generally bridge voltage, $V_b$, to maintain a neutral field between the field shield metal and the diaphragm for environmental conditions that may be encountered during normal operation. The maintenance of the neutral field across all active areas, even with very high accumulation of surface charge, ensures long term output stability of the device. Bench tests used to induce sense element charging and output drift confirm superior performance of the techniques disclosed herein.

As discussed herein, terminology relating to "electrical separation" generally refers to conditions adequate for maintaining a neutral field between electrical components. In some embodiments, electrical separation may also be referred to as electrical isolation. Electrical separation may be realized by application of intervening layers such as a passivation layer. In some embodiments, electrical separation may rely upon (or additionally make use of) biasing of a circuit element.

As discussed herein, the term "contact metal" generally refers to metal used for contact via regions of highly doped semiconductor materials. Contact metal may be any metal typical of industry, or otherwise deemed appropriate for use. The term "passivation" generally refers to an electrical isolation barrier separating different metal layers or separating metal from semiconductor. Materials used for a passivation may include oxide and/or nitride or other material common to industry. Passivation may also be provided as a physically protective barrier. As discussed herein, the term "bond pad" generally refers to a metal bond pad used to provide for wire bond or other suitable electrical contact to the device. In general, the bond pad is maintained at a desired bias voltage, $V_b$, while potential at other bond pads 15 is determined by the resistance of piezoresistors 61.

In some embodiments, the field shield is provided as a film of conductive metal or other material common to the industry. In general, P+ type of materials refer to highly acceptor doped region of semiconductor to achieve high conductivity; and, N+ type of materials refer to highly donor doped region of semiconductor to achieve high conductivity. An N+ contact via includes a metal-to-semiconductor contact formed in N-type semiconductor region, where contact resistance is low and ohmic. In the examples provided herein, the N+ contact via is at maintained at a desired bias voltage, $V_b$. In the examples provided herein, the P+ contact via includes a metal-to-semiconductor contact formed in P-type semiconductor region, where contact resistance is low and ohmic.

As discussed herein, P− type of semiconductor material refers to moderate or lower acceptor doped region of semiconductor material. P− type semiconductor material may be used to form a piezoresistor of desired resistance. As discussed herein, N-type semiconductor material generally refers to donor doped bulk semiconductor material that forms the flexible diaphragm of the pressure sensor. As discussed herein, P-Type of semiconductor material generally refers to acceptor doped bulk semiconductor material. In some embodiments, the pedestal is formed from glass.

As discussed herein, "substantially eliminating influence of external charge on the sensing element" generally refers to reducing influence of charge accumulation on output of the sensing element. For example, substantially eliminating influence of external charge results in reductions of output drift to levels that are within acceptability for a particular design, or from the perspective of a designer, manufacturer, user, or other similarly interested person. Alternatively, "substantially" eliminating influence of external charge (and other related terminology) results in reductions of output drift to levels that exceed the performance of competitive designs.

Components described herein may be fabricated in any manner deemed appropriate. For example, semiconductor materials may be grown by deposition, removal, patterning, and other similar techniques. Exemplary techniques include, without limitation, physical vapor deposition (PVD), chemical vapor deposition (CVD), electrochemical deposition (ECD), molecular beam epitaxy (MBE) and atomic layer deposition (ALD). Photolithography, etching and other techniques may be used as appropriate.

Various other components may be included and called upon for providing for aspects of the teachings herein. For example, additional materials, combinations of materials and/or omission of materials may be used to provide for added embodiments that are within the scope of the teachings herein.

When introducing elements of the present invention or the embodiment(s) thereof, the articles "a," "an," and "the" are intended to mean that there are one or more of the elements. Similarly, the adjective "another," when used to introduce an element, is intended to mean one or more elements. The terms "including" and "having" are intended to be inclusive such that there may be additional elements other than the listed elements.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A pressure sensing element comprising a sensing sub-element disposed on a diaphragm, the element comprising:
   a field shield disposed over the sub-element, a contact via and an interconnect disposed between the sub-element and the contact via,
   and a field shield circuit configured to substantially eliminate influence of external charge on the sub-element during operation by applying a potential to a substrate of the diaphragm and the field shield.

2. The sensing element of claim 1, wherein the sub-element comprises at least one piezoresistive element.

3. The sensing element of claim 1, wherein the sub-element is implanted into the diaphragm.

4. The sensing element of claim 1, wherein a layer is disposed between the field shield and the sub-element.

5. The sensing element of claim 4, wherein the layer comprises a passivation layer.

6. The sensing element of claim 1, wherein the field shield is configurable to substantially eliminate signal leakage within the sensing element.

7. The sensing element of claim 1, wherein the field shield is disposed over the sub-element by deposition and photolithography.

8. The sensing element of claim 1, wherein sources of the external charge comprise at least one of oil in which the sensing element is at least partially immersed and other components surrounding the sensing element.

9. A pressure sensor comprising:
   a pressure sensing element comprising a sensing sub-element disposed on a diaphragm, the element comprising a shield disposed over the sub-element, a contact via and an interconnect disposed between the sub-element and the contact via, the field shield configured to substantially eliminate influence of external charge on the sub-element during operation by operation of a field shield circuit configured to apply a potential to a substrate of the diaphragm and the field shield; and
   a port for exposing the pressure sensing element to a pressure environment.

10. The pressure sensor as in claim 9, comprising another port and another pressure sensing element.

11. The pressure sensor as in claim 10, wherein a top side of the diaphragm and a back side of the port are coupled by a reservoir of oil.

12. The pressure sensor as in claim 10, wherein measurements of differential pressure span a range of between about 0.2 bar and 1 bar.

13. The pressure sensor as in claim 10 configured for measuring differential pressure across a Venturi flow tube.

14. The pressure sensor as in claim 10 configured for measuring mass air flow.

* * * * *